United States Patent [19]
Galvagni

[11] Patent Number: 5,388,024
[45] Date of Patent: Feb. 7, 1995

[54] TRAPEZOID CHIP CAPACITOR

[75] Inventor: John Galvagni, Surfside Beach, S.C.

[73] Assignee: AVX Corporation, Del.

[21] Appl. No.: 100,375

[22] Filed: Aug. 2, 1993

[51] Int. Cl.⁶ .............................................. H01G 1/14
[52] U.S. Cl. .................................... 361/309; 361/313; 361/330; 29/25.42
[58] Field of Search ............... 361/301.1, 301.2, 301.4, 361/308.1, 311, 312, 313, 320, 321.2, 323, 328, 330, 329, 309; 29/25.42; 427/79

[56] References Cited

U.S. PATENT DOCUMENTS

| | | | |
|---|---|---|---|
| 2,892,139 | 6/1959 | Salzberg | 361/312 |
| 2,924,814 | 2/1960 | Simpson | 361/328 |
| 2,966,429 | 12/1960 | Darrel | 430/97 |
| 3,308,358 | 3/1967 | Blank | 361/329 |
| 4,205,364 | 5/1980 | Pereira, Jr. | 361/303 |
| 4,912,597 | 3/1990 | Carpenter | 361/329 |
| 5,012,385 | 4/1991 | Kurabayashi et al. | 361/328 |
| 5,195,019 | 3/1993 | Hertz | 361/328 |

FOREIGN PATENT DOCUMENTS 0068915 3/1989 Japan ................... 361/311

Primary Examiner—Bruce A. Reynolds
Assistant Examiner—Michael D. Switzer
Attorney, Agent, or Firm—Mark T. Basseches

[57] ABSTRACT

A ceramic capacitor and method of making same is disclosed. The capacitor is trapezoidal in longitudinal section with the electrodes exposed at the angled ends of the trapezoid. The ends face generally in the same direction such that both ends may be simultaneously exposed to a sputtering or vapor deposition procedure and thus sputtered in a single operation without requiring re-masking. The sputtering step, in addition to providing terminations, functions to mechanically couple a multiplicity of capacitors into a compact grouping from which one or more capacitors may be readily extracted.

5 Claims, 2 Drawing Sheets 5,388,024

TRAPEZOID CHIP CAPACITOR

BACKGROUND OF THE INVENTION

The present invention is directed to a ceramic chip capacitor and method of making same. More particularly, the invention relates to a ceramic capacitor having a unique configuration which provides significant functional advantages in contrast to conventional capacitors of the ceramic type.

The invention is further directed to a novel chip capacitor configuration which greatly facilitates the manner in which terminations may be applied thereto, and which enables multiple chips to be readily inserted in a circuit to vary the capacitance.

THE PRIOR ART

Ceramic capacitors are in commonplace use in electronic devices, such as computers, television sets and the like. With current tendency toward miniaturization it is highly desirable to make the most efficient use possible of the surface area of the PC board on which such capacitors, as well as other electronic components, are mounted.

Conventional ceramic capacitors, and particularly capacitors which are surface mounted on PC boards, have heretofore been rectangular in longitudinal section. Such devices are typically fabricated by depositing rectangular areas of electroding material, i.e. palladium or platinum, on thin sheets of "green" ceramic material, i.e. sheets wherein finely divided ceramic powder is held in a binder.

In practice a multiplicity of sheets are stacked such that the major portions of electrode material are in registry, the edge portions of odd numbered electrode components projecting to one side of the registering portions of the electrodes and edge portions of even numbered layers projecting to the opposite side of the registering portions. The capacitor preform is fabricated by stamping the stack in such manner that the end portions of the odd numbered electrodes are exposed at one edge of the stack and the edge portions of the even numbered electrodes at the other end. The capacitor preform, which is rectangular in transverse and longitudinal section, is thereafter heated to drive off organic binder components, following which it is subjected to sintering temperatures. The resultant capacitors are thereafter terminated, i.e. conductive material is applied in some manner to the exposed electrodes present at opposed ends of the capacitor.

Application of terminating material presents a significant problem particularly in the case of extremely small capacitors which may be only a few millimeters in each dimension. Since any conductive terminating material which bridges the area between the electrodes of opposite polarity will render the capacitor useless, it will be recognized that careful masking must be effected to assure workable devices.

Typical terminating processes involve application of a mixture of conductive powdered metal, e.g. silver, with low melt glass frit over the edges of the capacitor having exposed electrodes and subsequent heating to melt the frit and bond the metal of the termination paste to the electrodes. It has been proposed, in order to avoid the use of silver-frit terminating methods, to terminate the capacitors by sputtering or other vapor deposition methods. The problem inhering in such methods resides in the necessity for masking the capacitors, subjecting the masked capacitors to the vapor deposition step to coat one electrode, and thereafter reversely positioning the re-masked capacitor to vapor deposit a termination over the surfaces having exposed electrode ends of opposite polarity. The care with which the masking operation must be carried out is underscored when it is recognized that sputtering, perhaps the most simple of the vapor deposition steps, results in the metal particles being discharged in a random pattern whereby particles impinging upon surfaces to be coated may be moving in any of a multiplicity of different directions.

SUMMARY OF THE INVENTION

The present invention may be summarized as directed to a novel ceramic capacitor configuration and method of fabricating same, and particularly terminating the same. The capacitor is characterized in that it presents a smaller "footprint" than a conventional chip capacitor of equal electrical characteristics.

More specifically, the capacitor is formed in the configuration of an isosceles trapezoid in longitudinal section. A capacitor of this configuration has the advantage that when surface mounted with the minor base downwardmost, the entirety of any solder connection between PC traces and capacitor terminals will be sheltered by or gathered within the overhang provided by the upwardmost directed major base of the capacitor, i.e. as a result of surface tension. Other advantages include lowered inductance and lowered electrical resistance as a result of the greater exposed area of electrode which is engaged by the termination.

In addition to the functional advantages of the trapezoid shaped capacitor, substantial manufacturing advantages, and particularly terminating advantages, are realized. More particularly, termination is effected by placing the major or larger base portion of the trapezoid on a support surface and stacking a number of the trapezoidal capacitors in side to side relation. Thereafter, the minor base portion of the trapezoid is masked, leaving as the sole exposed portions of the trapezoid only the angular end faces linking the major and minor bases, the electrodes being exposed at such end faces. It is now possible to expose the grouped capacitors to a vapor deposition step, i.e. sputtering, the metal being dispensed generally in a direction from the minor toward the major base portion of the trapezoid. Accordingly in a single step, it will be appreciated that terminations are applied to the electrodes of both polarities.

Upon removal of the masking material covering the minor base of the series of capacitors, the individual capacitors may be separated by breaking the bond between adjacent capacitors formed by the sputtered metal. Alternatively, a group or stack of still connected capacitors may be packaged without separation leaving it to the end user to separate the capacitors either manually or automatically. Additionally, it is feasible for the end user to apply an increased capacitance by removing two three or more capacitors as a unit from the stack, the capacitors remaining linked at least in part by the applied termination, and soldering the multiple capacitor unit onto the PC board.

With the foregoing in mind, it is an object of the invention to provide a ceramic capacitor which makes efficient use of the area of the PC board and by shielding the connecting solder beneath the geometry of the capacitor minimizing the possibility that the solder connection between capacitor and PC board will short-circuit to other elements on the board.

Still a further object of the invention is the provision of a capacitor which makes highly efficient use of the area of the PC board.

A still further object of the invention is the provision of a capacitor structure which greatly facilitates the manner in which the capacitor may be terminated.

Still a further object of the invention is the provision of a block or series of discrete capacitors in side by side array, the capacitors being maintained in the noted side by side orientation at least in part by the termination material, the connection being preferably augmented by a readily frangible adhesive layer. This gang or group of releasably attached capacitors is highly advantageous in that it presents a compact group for shipping, is readily adapted for dispensing, i.e. as from a magazine which ejects one or more of the capacitors from the stack, and provides the further advantage of permitting the manufacturer to provide a capacitance which is a multiple of the capacitance of the-individual capacitors simply by separating two or more capacitors as a unit from the stack and soldering the multiple capacitors in a single soldering operation.

DETAILED DESCRIPTION OF DRAWINGS

Figure 1:
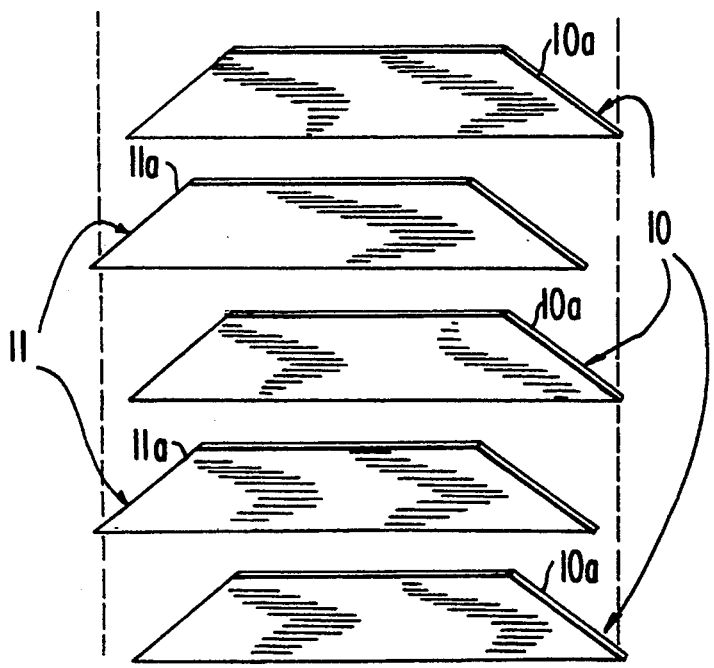
FIG. 1 is an exploded perspective view of the electrode components of the capacitor, the dielectric layers having been omitted.
Figure 2:
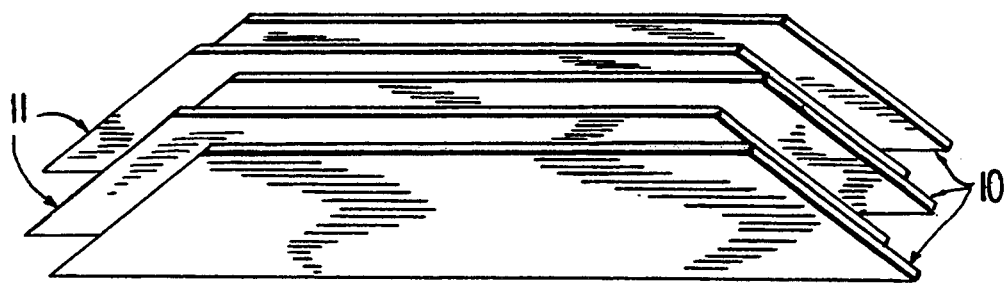
FIG. 2 schematically discloses the electrode layers in a stacked condition, the dielectric again having been omitted for purposes of clarity.

Referring to FIG. 1 there is disclosed in schematic fashion a series of electrode patterns 10 and 11, the patterns being imprinted on sheets of green ceramic (not shown). The electrodes 10 and 11 are trapezoidal in plan and are stacked in such manner that the outer end margins 10a of the electrodes 10 are in registry and project beyond the inner margins of electrodes 11 and the end margins 11a of electrodes 11 project beyond the inner margins of electrodes 10. The assembled electrodes (without dielectric) are schematically illustrated in FIG. 2.

Figure 3:
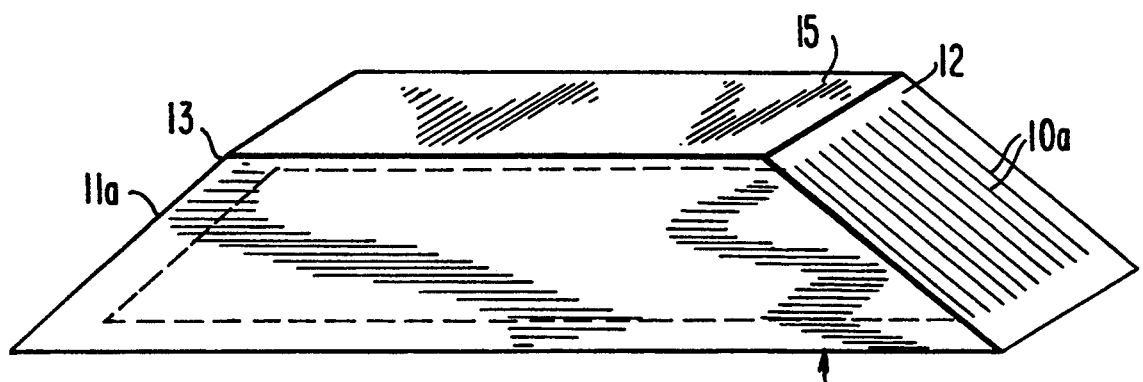
FIG. 3 is a perspective view of a finished capacitor prior to application of terminations.

The manufacturing process for fabricating the capacitor as shown in FIG. 3 is altogether conventional (except configuration) and need only briefly be described herein. The electrodes 10 and 11 which are carried by intervening green ceramic sheets, are aligned as shown, subjected to pressure, diced from the stacked green ceramic sheets such that the edge portions 10a of electrodes 10 are exposed at end 12 of the capacitor preform, and the end portions 11a of electrodes 11 are exposed an end 13 of the capacitor preform.

The green ceramic sheets are typically comprised of finely divided ceramic powders, such as barium titanate, supported in a polymeric binder and formed into thin sheets. The electrodes, which may be screened onto the green ceramic sheets, are typically comprised of noble metals which are heat resistant, by way of example palladium, platinum or gold. The capacitor preforms of FIG. 3 are converted to capacitors by first heating to drive-off the organic components of the green ceramic and the ink suspension holding the noble metal particles, and thereafter heated to elevated temperatures to sinter the ceramic dielectric components. Details of the fabrication of green ceramic, imprinting, stacking and sintering may be derived from patents such as Rodriquez Re 26,421, the teachings whereof are herein incorporated by reference.

By way of example, and without limitation, a suitable capacitor configuration may include a major base portion 14 which is 120 mils in length and 60 mils in width, the minor base portion 15 being approximately 60 mils in length. Ideally, the angle defined between the end faces 12, 13 and the base 14 is in the range of 30 to 60 degrees, 45 degrees being optimum. If the angle is more acute than 30 degrees there is a tendency to crumble at the sharp edges defined between ends and base. If the angle exceeds about 60 degrees, there is presented a problem as respects exposure to the sputtering beam utilized in the termination procedure next to be described.

Figure 4:
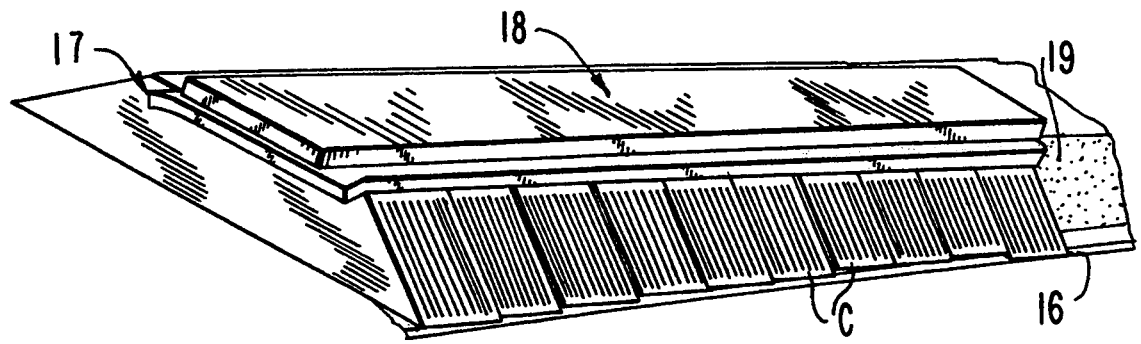
FIG. 4 is a schematic perspective view of a multiplicity of completed capacitors positioned for reception of the termination materials.
Figure 5:
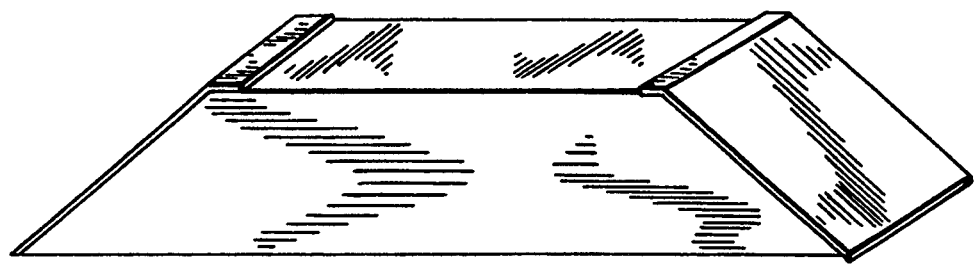
FIG. 5 is a perspective view of a terminated capacitor.

In FIG. 4 a series of capacitors C have been assembled in a sputtering jig for termination. The capacitors C are assembled in side by side relation on support surface 16, and all or virtually all of the minor base portions 15 of the capacitors are covered by a glass fiber ribbon 17. It may be desirable in certain instances that the ribbon widths be slightly less than the total lengthwise dimension of the minor base portions 15.

The glass ribbon 17 is covered by a metallic bar member 18 which functions to maintain the ribbon in the desired position. The thus masked stack of capacitors are subjected to sputtering steps known per se whereby sputtered material is deposited solely on the ends 12, 13 where the electrode end portions are exposed.

By way of example, and in compliance with the best mode requirements of the Patent Office, the sputter coating may include an initial 1000 angstroms of chrome, a further 3000 angstroms of nickel, followed by an additional 3000 angstroms of silver. Where adhesion of the stack of capacitors is desired, it may be preferable to increase the thickness of the sputter coating, since the coating tends to maintain the sputtered capacitors in stacked relation. Optionally, where a stack of capacitors is desired (as opposed to individual loose capacitors) a thin frangible adhesive layer 19 may be applied to the support surface, the adhesive releasably bonding the adjacent major base portions to each other.

As will be apparent, the stack of capacitors (see FIG. 7) provides a compact readily shipped and readily handled unit from which individual capacitors may be removed as desired. The stack lends itself particularly to automated feeding, whereby the entire stack may be contained in a complementally configured tube the uppermost one or ones of the stack being removable.

Figure 7:
FIG. 7 is a perspective view of a stack or series of capacitors in accordance with the invention.

A particular advantage of the stacked units as shown in FIG. 7 resides in the ability of the end user to vary the capacitance as a multiple of capacitance of the individual units C by simply snapping off two capacitors if twice the capacitance is desired etc. and soldering the desired multiple group of capacitors into the circuit as a unit.

The simultaneous presentation in the noted capacitor configuration of both of the surfaces 12, 13 to be terminated, to the sputtering beam eliminates the necessity of re-masking and re-positioning the capacitor as is the case in conventional capacitors where the surfaces to be terminated are parallel to each other and face in opposite directions.

Figure 6:
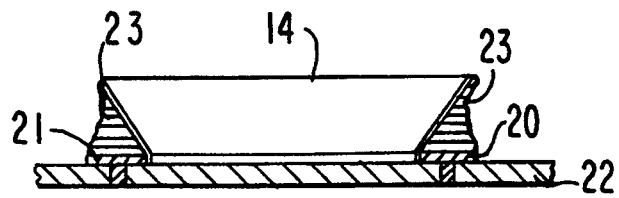
FIG. 6 is a vertical sectional view of a capacitor in accordance with the invention soldered to a PC board.

In FIG. 6 there is shown schematically a capacitor in accordance with the invention soldered to the terminals 20, 21 of PC board 22. The solder globs 23, as a result of surface tension, gather beneath the overhang defined by the now uppermost major body portion 14. The danger of shorting to adjacent components which inheres in the use of rectangular capacitors is eliminated since the solder flow with such devices in all instances projects laterally beyond the end of the capacitor body.

A further benefit of the configuration of the capacitor resides in the fact that due to the angular end surfaces 12, 13 at which the electrodes are exposed, there is an increased length of electrode contacted by the termination material thereby reducing the internal resistance of the capacitor.

From the foregoing description, it will be appreciated that there is provided in accordance with the invention a novel capacitor device which by virtue of its configuration may be efficiently surface mountable on PC boards without danger of solder projecting beyond the area occupied by the major base of the capacitor. The configuration further permits the use of greatly simplified termination procedures, since, although the surfaces on which termination material is to be deposited are separated, such surfaces are nonetheless facing in a direction enabling the sputtering of both surfaces with a single sputtering beam.

The sputtering procedure performs the additional function, either alone on in concert with auxiliary adhesive or the like, of mechanically coupling the multiplicity of capacitors which have been simultaneously sputtered to provide a compact, readily shippable and handleable unit from which one or multiples of capacitors may be readily separated as desired.

As will be apparent to skilled workers in the art familiarized with the instant disclosure numerous details of structure and the like may be made without departing from the spirit of the invention. Accordingly, the invention is to be broadly construed within the scope of the appended claims.

Having thus described the invention and illustrated its use, what is claimed as new and is desired to be secured by Letters Patent is:

1. A surface mountable multilayer ceramic capacitor assembly comprising a plurality of discrete readily separably interconnected ceramic capacitors arranged in a stack, said capacitors each having mutually spaced first and second terminations of opposite polarity, said first and second terminations of said capacitors in said stack being disposed in abutting relation to the respective first and second terminations of adjacent said capacitors in said stack, and continuous first and second conductive readily fractured termination films mechanically and electrically linking the respective first and second terminations of said capacitors in said stack, whereby individual capacitors or groups of mechanically and electrically connected capacitors as a sub-unit may be separated from said stack.

2. A capacitor assembly in accordance with claim 1 wherein said capacitors in said stack are in the configuration of isosceles trapezoids in longitudinal section and include major and minor bases and end faces angularly related to said bases, said first and second terminations being bonded to said end faces.

3. A capacitor assembly in accordance with claim 2 and including a readily ruptured adhesive strip member linking said capacitors.

4. The method of manufacturing a connected group of multilayer ceramic capacitors comprising the steps of providing a plurality of monolithic parallelepiped capacitors having a configuration, in longitudinal section, of an isosceles trapezoid and having a major base, a minor base in spaced parallel relation to said major base and inclined end faces extending between the respective ends of said major and minor bases, said capacitors including alternating ceramic and conductive electrode layers, alternate said electrode layers including end portions extending to opposite said end faces, comprising the steps of placing said capacitors in side by side abutting relation with said major base portions on a support surface, placing a mask over said minor base portions and thereafter subjecting said capacitors to a metallic vapor deposition step simultaneously to metal coat said end faces, said metal being deposited as continuous strips to integrate said capacitors into a stack.

5. The method in accordance with claim 4 wherein said metal deposition step is effected by sputtering.

* * * * *